US006538337B2

(12) United States Patent
Song

(10) Patent No.: US 6,538,337 B2
(45) Date of Patent: Mar. 25, 2003

(54) BALL GRID ARRAY PACKAGE FOR PROVIDING CONSTANT INTERNAL VOLTAGE VIA A PCB SUBSTRATE ROUTING CONFIGURATION

(75) Inventor: Ho-Sung Song, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/851,093

(22) Filed: May 9, 2001

(65) Prior Publication Data

US 2002/0020928 A1 Feb. 21, 2002

(30) Foreign Application Priority Data

Nov. 13, 2000 (KR) .......................... 2000-67108
Aug. 17, 2000 (KR) .......................... 2000-47503

(51) Int. Cl.[7] .............................. H01L 23/45
(52) U.S. Cl. ...................... 257/786; 257/690
(58) Field of Search ................ 257/678, 690, 257/698, 700, 734, 780, 786

(56) References Cited

U.S. PATENT DOCUMENTS 5,739,585 A      4/1998  Akram et al.
5,787,575 A  *   8/1998  Banerjee et al. ............ 29/832
6,034,427 A  *   3/2000  Lan et al. .................. 257/698
6,049,129 A      4/2000  Yew et al.
6,329,222 B1    12/2001  Corisis et al.
6,011,695 A1 *   1/2002  Dumke et al. ............. 361/777
2001/0001714 A1  5/2001  Toshiyuki et al.

FOREIGN PATENT DOCUMENTS

KR        2000-0013881        3/2000

* cited by examiner

Primary Examiner—Michael S. Lebentritt
Assistant Examiner—Brad Smith
(74) Attorney, Agent, or Firm—Volentine Francos, PLLC

(57) ABSTRACT

A ball grid array (BGA) package provides a constant internal voltage via an auxiliary routing configuration of a printed circuit board (PCB). The BGA package includes a substrate having an opening, a plurality of pads attached to an upper surface of the substrate, a semiconductor chip which has a plurality of bonding pads and which is attached to a lower surface of the substrate, an internal connection mechanism for connecting at least one of the bonding pads to at least one of the plurality of pads via the opening, and a filling material for filling the opening to protect the bonding pads and the internal connection mechanism. At least one of the plurality of bonding pads is electrically connected to at least one other of the plurality of bonding pads via an auxiliary routing configuration within the substrate.

11 Claims, 5 Drawing Sheets

BALL GRID ARRAY PACKAGE FOR PROVIDING CONSTANT INTERNAL VOLTAGE VIA A PCB SUBSTRATE ROUTING CONFIGURATION

BACKGROUND OF THE INVENTION

1. Field of the Invention

The present invention relates to a ball grid array (BGA) package of a chip scale, and more particularly, to a BGA package for providing a constant internal voltage by forming an auxiliary routing configuration on a printed circuit board (PCB) substrate of the BGA package.

2. Description of the Related Art

As semiconductor devices are further minimized in size, the integration density of corresponding semiconductor integrated circuit devices increases, which in turn increases the number of input/output pins. As a result, the ball grid array (BGA) package has been developed as a type of semiconductor package.

When compared with conventional plastic lead frame packages, the BGA package occupies substantially less area when mounted on a main board, while at the same time the electrical characteristics of the BGA package are considered to be quite excellent.

The BGA package differs from the plastic package in that, instead of a lead frame, the BGA package electrically connects a semiconductor chip and the main board via a circuit board, which is formed by external pads, such as a circuit routing configuration, and solder balls.

Since the external pads are formed on the surface of the circuit board that is opposite to the surface where the semiconductor chip is attached, the area of the BGA package can be reduced relative to the conventional plastic package.

FIG. 1 illustrates a conventional routing method of power lines in a chip. In FIG. 1, a semiconductor chip 10 (depicted as a memory chip) includes internal voltage lines 16, bonding pads 15, and banks or regions 11, 12, 13, and 14. The internal voltage lines 16 supply internal voltages, that is, a word line driving voltage (Vpp), a bit line driving voltage (Vbl), or a back bias voltage (Vbb) to each of the regions 11, 12, 13, and 14.

As the semiconductor devices become more highly integrated, the size of transistors used in a memory cell or a peripheral circuit decreases. However, the current required for each of the transistors does not decrease. As a result, the internal voltage line width for supplying the voltage effectively increases, relative to the now reduced-sized memory cell or peripheral circuit.

This problem is demonstrated by the following example. The level of the Vpp varies according to the position of the enabled word line, and the voltage dip of the Vpp is not identical in all parts of the chip 10. Thus, conventionally, in order to eliminate a difference in the Vpp level, the internal voltage line width for supplying the Vpp is increased, thereby decreasing a resistance R in the internal voltage line. However, if the internal voltage line width for supplying the internal voltage is increased, the size of the chip is also undesirably increased, thereby increasing production costs.

On the other hand, if the internal voltage line width for supplying the internal voltage is decreased, the size of the chip is also decreased, but the level of the internal voltage in regions A/B and regions C/D is varied, and this adversely affects chip operation.

FIG. 2 is a plan view of a conventional ball grid array (BGA) package. The BGA package includes a semiconductor chip 10 having a plurality of bonding pads 15, an opening 29 for exposing the bonding pads 15, a substrate 20 having a plurality of substrate pads 22, and a plurality of connectors 21, connecting the substrate pads 22 to the bonding pads 15.

The above described problem, in which the internal voltage line width for supplying an internal voltage is decreased and the level of the internal voltage in the regions A/B and the regions C/D is varied, cannot be compensated for in the conventional BGA package. Therefore, a need exits for a BGA package that can supply a constant internal voltage.

SUMMARY OF THE INVENTION

To solve the above problems, it is an object of the present invention to provide a ball grid array (BGA) package which supplies a constant internal voltage using an auxiliary routing configuration on a printed circuit board (PCB) of the BGA package.

Accordingly, to achieve the above object, according to one aspect of the present invention, there is provided a ball grid array (BGA) package. The BGA package includes a substrate having an opening, a plurality of pads attached to an upper surface of the substrate, a semiconductor chip having a plurality of bonding pads and attached to a lower surface of the substrate, an internal connection mechanism for connecting at least one of the plurality of bonding pads to at least one pad via the opening, and a filling material for filling the opening to protect the bonding pads and the internal connection mechanism. At least one of the plurality of bonding pads is electrically connected to at least one other bonding pad via an auxiliary routing configuration of the substrate.

Preferably, the at least one bonding pad and the at least one other bonding pad may be one of an internal voltage converter (IVC), Vpp, Vbb, and Vbl pads.

In another aspect of the present invention, the BGA package includes an internal routing configuration in the chip, for commonly connecting bonding pads to an internal voltage of the chip, and an auxiliary routing configuration of the PCB connected to the bonding pads. The resistance of the internal routing configuration is larger than that of the auxiliary routing configuration.

BRIEF DESCRIPTION OF THE DRAWINGS

The above object and advantages of the present invention will become more apparent from the detailed description of the preferred embodiments, with reference to the accompanying drawings, in which.

DESCRIPTION OF THE PREFERRED EMBODIMENTS

Figure 1:
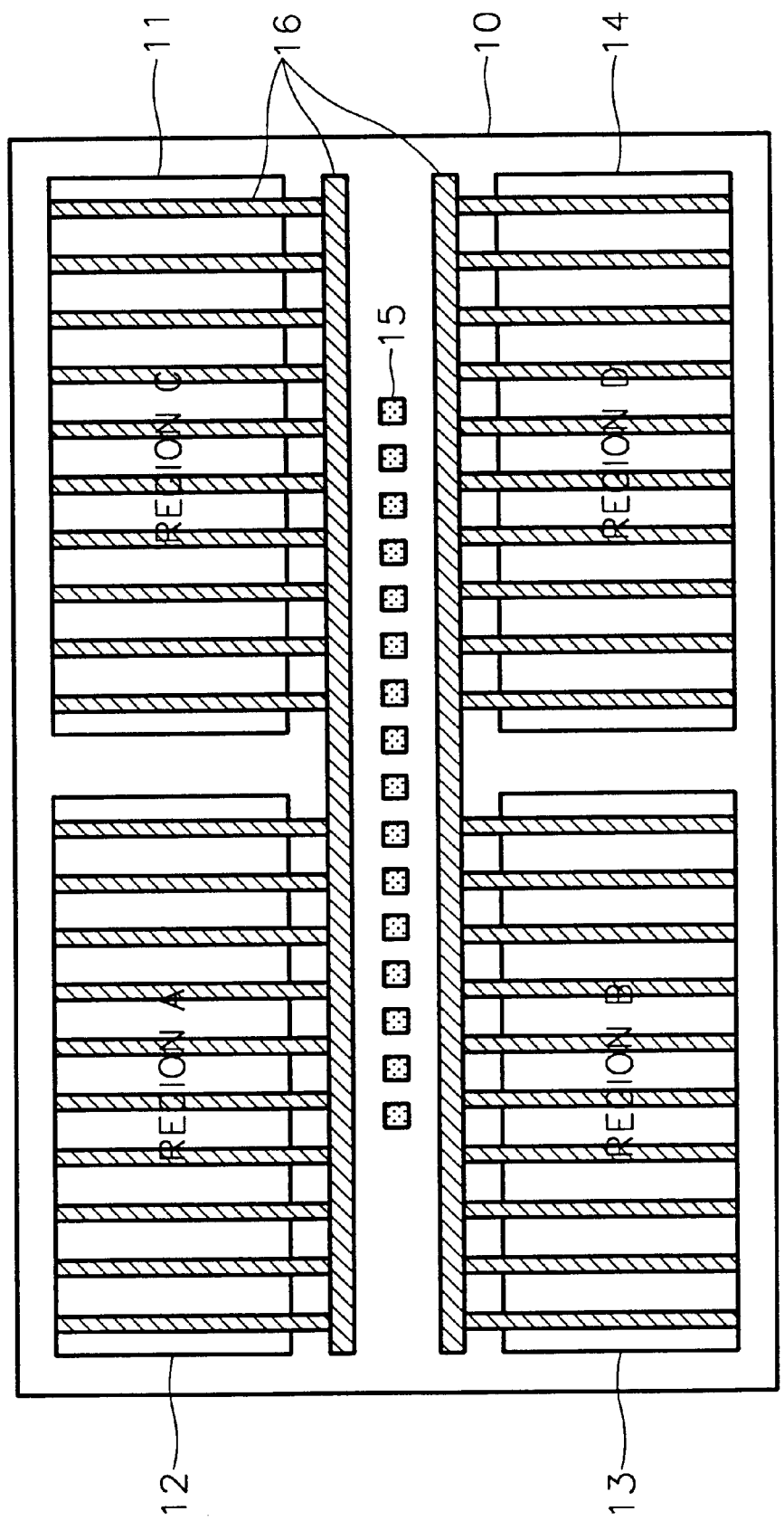
FIG. 1 illustrates a conventional method of routing power lines in a chip.
Figure 2:
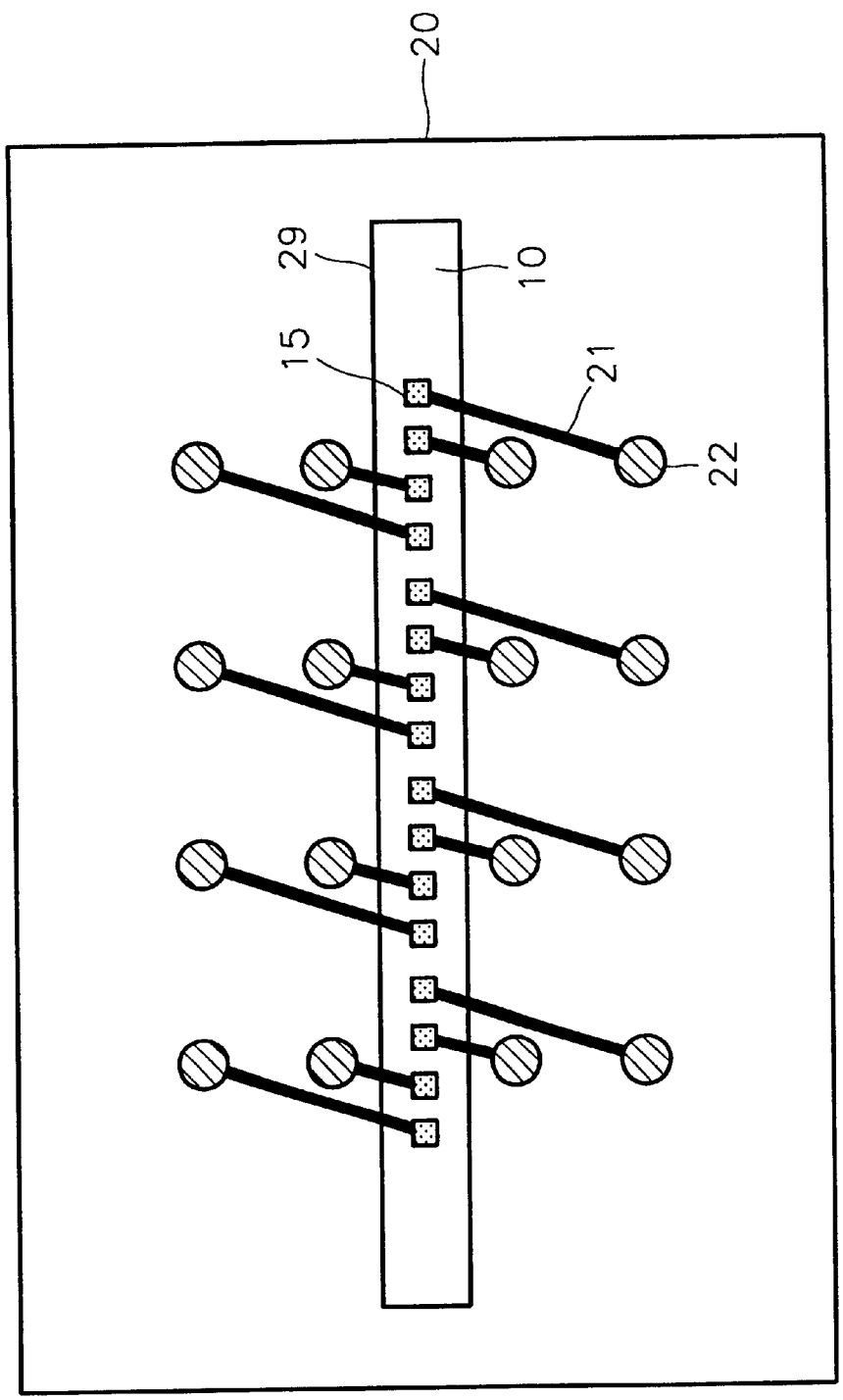
FIG. 2 is a plan view of a conventional ball grid array (BGA) package.

The present invention will be described more fully hereinafter with reference to the accompanying drawings in which preferred embodiments of the invention are shown by way of example. Like reference numerals refer to like elements throughout the drawings.

In general, as the capacity of a memory chip increases and the memory chip itself becomes more highly integrated, in order to satisfy AC and DC electrical parameters without degrading the reliability of the product, an internal voltage converter (IVC) is employed to provide a constant voltage regardless of the external voltage that is applied. However, while providing some stability, the IVC degrades the operational speed and reduces the low voltage margin. This is due to a drop in the internal operational voltage that is caused by a consumption current while operating the memory device in a low voltage region.

The ball grid array (BGA) package of the present invention is designed to use an auxiliary routing configuration to accommodate the external voltage supplied from the outside of the semiconductor device and to keep the internal voltage constant.

Figure 3:
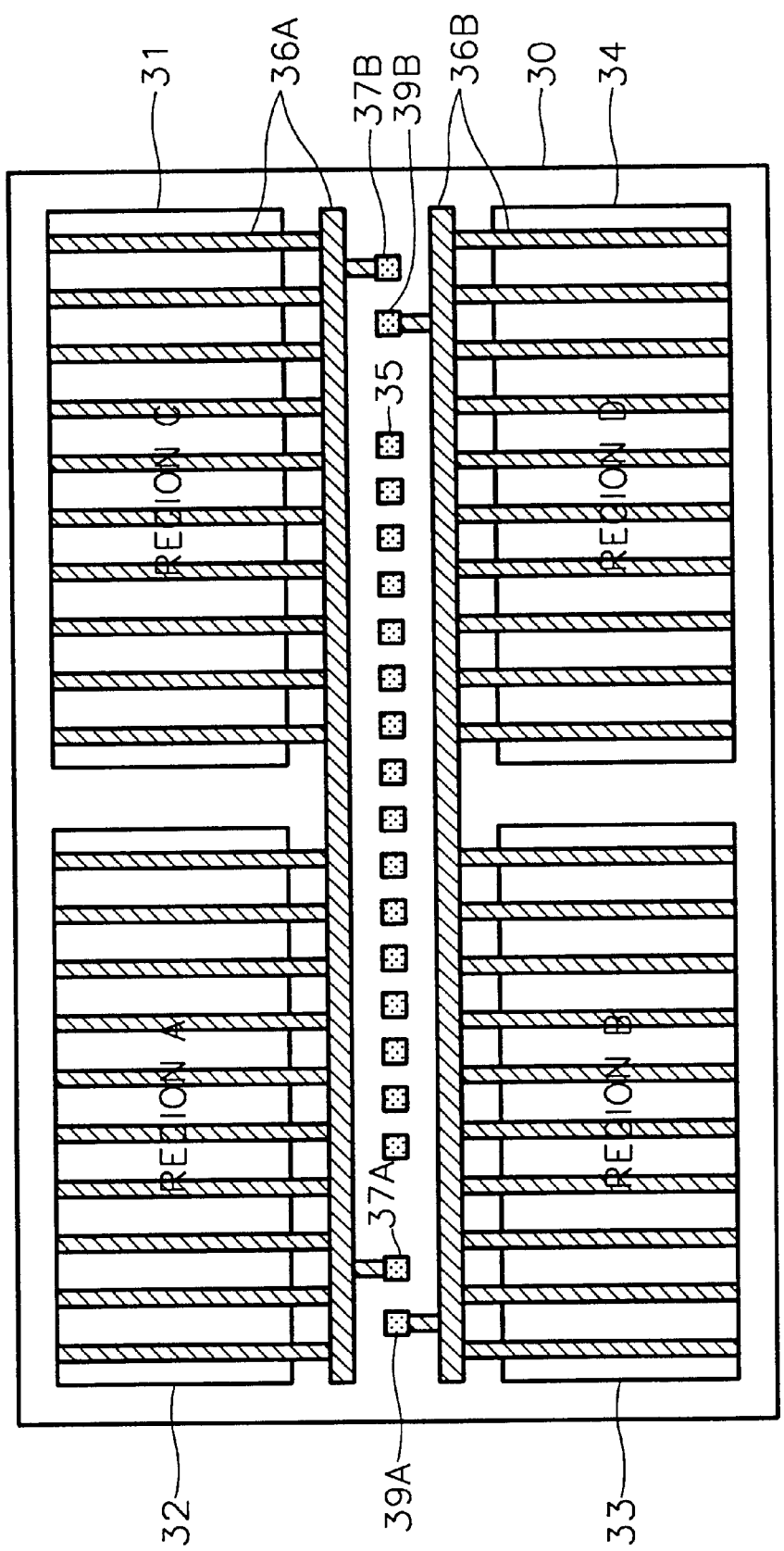
FIG. 3 illustrates a method of routing the internal voltage in a chip according to a preferred embodiment of the present invention.

FIG. 3 illustrates the routing of the internal voltage in a semiconductor memory chip according to a preferred embodiment of the present invention. In FIG. 3 a semiconductor memory chip 30 includes a plurality of banks or regions 31, 32, 33, and 34, lines 36A and 36B having a constant width for supplying internal voltage IVC, Vpp, Vbl or Vbb to each of the banks 31, 32, 33, and 34, and bonding pads 35, 37A, 37B, 39A, and 39B.

The lines 36A for supplying the internal voltage IVC, Vpp, Vbl, or Vbb to the bank 32 may either be connected to, or separated from the lines 36A for supplying the internal voltage IVC, Vpp, Vbl, or Vbb to the bank 31. Likewise, the lines 36B for supplying the internal voltage IVC, Vpp, Vbl, or Vbb to the bank 33 may either be connected to, or separated from and the lines 36B for supplying the internal voltage IVC, Vpp, Vbl, or Vbb to the bank 34. The internal voltage is supplied from one of the lines 36A or 36B to the banks 31, 32, 33, and 34.

Each of the banks 31, 32, 33, and 34 includes memory cells for storing data and a peripheral circuit (not shown) for inputting/outputting the data of the memory cells.

In general, the bonding pads 35, 37A, 37B, 39A, and 39B are arranged along a line in the center of the semiconductor chip 30, and function to input/output the internal voltage or a predetermined signal to the semiconductor chip 30.

The bonding pads 37A, 37B, 39A, and 39B according to the preferred embodiment are each connected to a predetermined portion of one of the lines 36A or 36B. The bonding pads 37A and 37B supply the internal voltage IVC, Vpp, Vbl, or Vbb to the banks 31 and 32, and the bonding pads 39A and 39B supply the internal voltage IVC, Vpp, Vbl, or Vbb to the banks 33 and 34. Note that rather than an internal voltage, the lines 36A or 36B can be signal lines for transmitting a predetermined signal. Each of the bonding pads 37A and 39A are electrically connected to the bonding pads 37B and 39B by the following BGA package.

Figure 4:
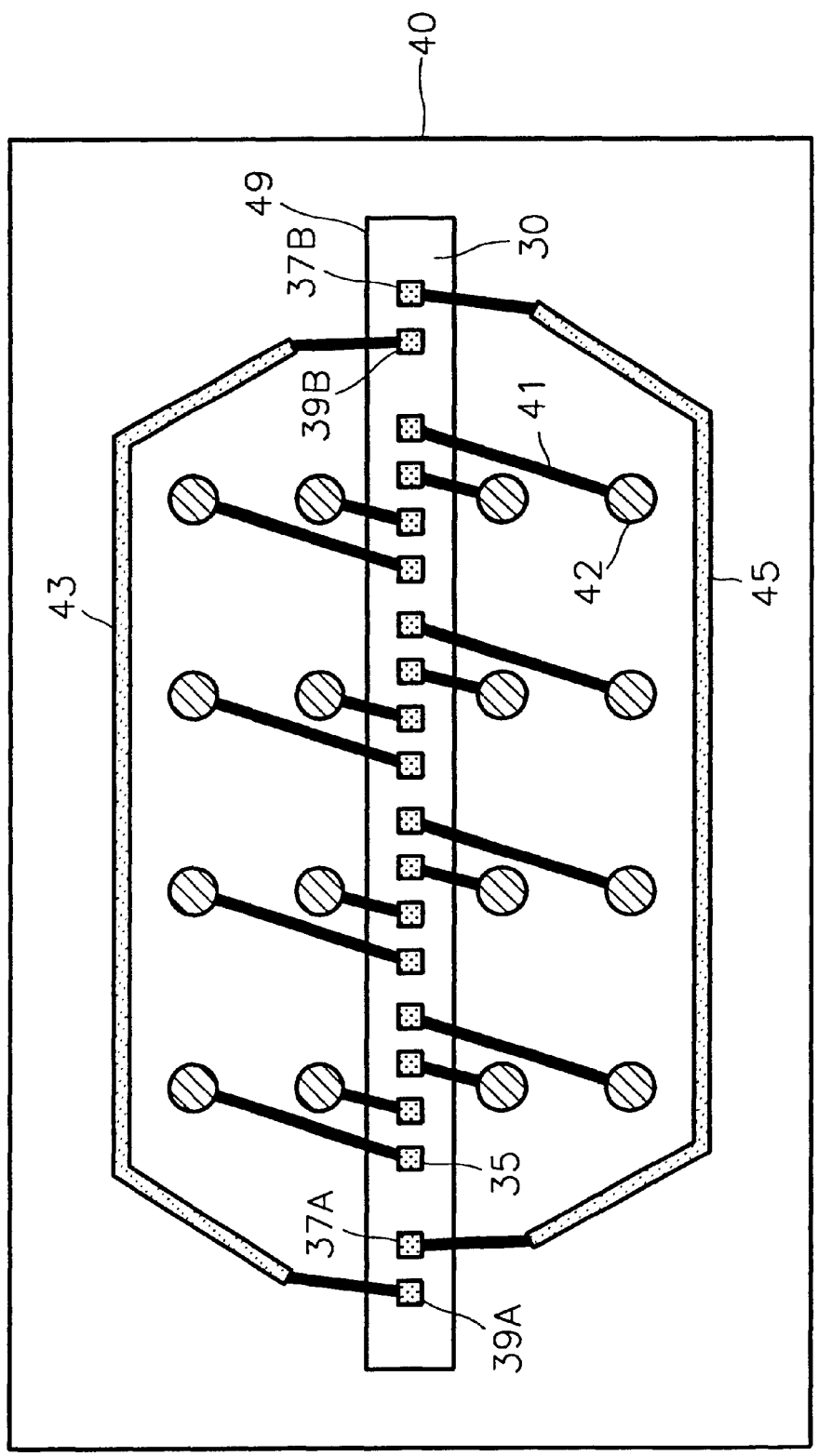
FIG. 4 is a plan view of a BGA package according to a preferred embodiment of the present invention.

FIG. 4 is a plan view of a BGA package according to a preferred embodiment of the present invention. In FIG. 4, a substrate 40 having the size of the semiconductor chip 30 is attached to the semiconductor chip 30 of FIG. 3. The semiconductor chip 30 is attached to a lower surface of the substrate 40 by a non-conductive attaching material, for example, adhesive resin or adhesive tape.

The bonding pads 35 (hereinafter referred to as a 'first group' of bonding pads) are electrically connected to a plurality of pads 42, which are mounted on an upper surface of the substrate 40, via an opening 49 in the substrate 40 and a plurality of internal connection mechanisms 41. Wire bonds or beam leads are exemplary embodiments of the internal connection mechanism 41. The pads 42 include external pads such as solder balls (not shown) for electrically and mechanically connecting to an external device.

The other bonding pads 37A, 37B, 39A and 39B (hereinafter referred to as a 'second group' of bonding pads) are electrically connected to one another via auxiliary routing configurations 43 and 45 of the substrate 40, and do not include the external pads 42. Specifically, bonding pads 37A and 37B are electrically connected to each other via the auxiliary routing configuration 45, and bonding pads 39A and 39B are electrically connected to each other via the auxiliary routing configuration 43 of the substrate 40. Wire bonds, beam leads or other equivalent structures may be used for the auxiliary routing configurations 43 and 45 of the substrate 40. Bonded portions of the bonding pads are encapsulated by a non-conductive material to protect the bonded portions from the external environment. The substrate 40 of the BGA package may be a single layer substrate (as in FIG. 4) or a multi-layer substrate.

Therefore, in the BGA package of the present invention, the first group of bonding pads 35 are connected to the solder balls, and the second group of bonding pads 37A and 37B, or 39A and 39B, are connected to the auxiliary routing configurations 43 and 45 of the substrate 40.

Since the internal voltage IVC, Vpp, Vbl, or Vbb is simultaneously input via is the second group of bonding pads 37A and 37B or 39A and 39B, the effects of a voltage dip relative to the position of peripheral devices for consuming power in the semiconductor chip 30 is reduced.

Figure 5:
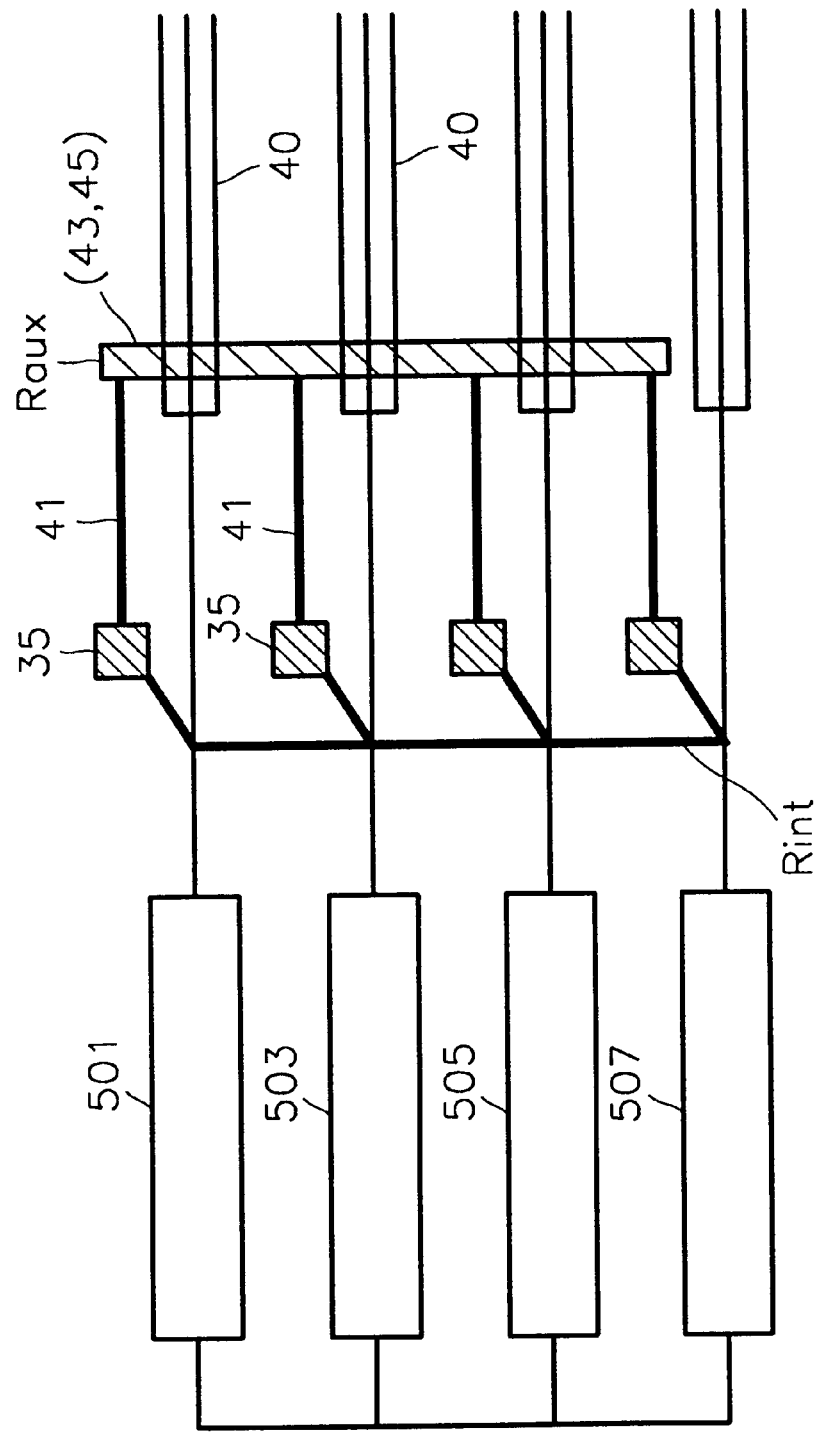
FIG. 5 specifically illustrates an example in which the internal voltage in the chip is connected to a substrate routing configuration.

FIG. 5 illustrates a view of a structure where the internal voltage in the chip is connected to an auxiliary routing configuration. Hereinafter, for simplicity and convenience of explanation, only the Vpp embodiment among the internal voltages IVC, Vpp, Vbl, or Vbb will be described.

Referring to FIG. 5, assume that there is one Vpp generator 501, 503, 505, and 507 for each of the banks 31, 32, 33, and 34, and that the Vpp levels of each of the banks 31, 32, 33, and 34 are different.

In order to eliminate the difference in the Vpp levels of each of the banks, an internal routing configuration Rint is connected between Vpp generators 501, 503, 505, and 507 in the chip. Due to the small area of the chip, the width of the internal routing configuration Rint cannot be increased, and as a consequence, its resistance is large.

As a result of the large resistance, it takes a long time before a predetermined constant level is reached for the Vpp generated by the Vpp generators 501, 503, 505, and 507. However, in the BGA package according to the present invention, auxiliary routing configurations Raux 43 and 45 are formed on the substrate 40 of the BGA package, which function to reduce the difference in the voltage, so that the Vpp can quickly reach a predetermined constant level.

Preferably, the resistance of the internal routing configuration Rint between the Vpp generators 501, 503, 505, and 507 is greater than the resistance of the auxiliary routing configurations Raux 43 and 45.

Accordingly, the internal voltage IVC, Vpp, Vbl, or Vbb can be kept constant via the bonding pads 37A, 37B, 39A, and 39B and the auxiliary routing configurations 43 and 45.

In the BGA package according to the present invention, since the width of the lines 36A and 36B can be reduced, the size of the semiconductor chip can be reduced, and the internal voltage level in the semiconductor chip can be maintained in a stable manner. Accordingly, due to a reduction in the size of the semiconductor chip, the net die per wafer is increased, and the production cost of the semiconductor chip is reduced.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A ball grid array (BGA) package, comprising:
a substrate having a first surface, and a second surface;
a plurality of substrate pads attached to the first surface of said substrate;
a semiconductor chip attached to said substrate, said chip having an external surface and a plurality of bonding pads disposed on said external surface;
an electrical connector electrically connecting at least one of said plurality of bonding pads to at least one of said plurality of substrate pads;
a filling material protecting the bonding pads and the internal routing configuration; and
at least one auxiliary routing configuration disposed on a portion of the substrate, each said auxiliary routing configuration electrically connecting at least one of said plurality of bonding pads to at least one other of said plurality of bonding pads without being electrically conductively connected throughout the substrate to any of said plurality of substrate pads.

2. The BGA package according to claim 1, wherein said electrical connector is a beam lead.

3. The BGA package according to claim 1, wherein said plurality of substrate pads comprise solder balls, and said electrical connector electrically connects a plurality of said bonding pads to a plurality of said solder balls.

4. A ball grid array (BGA) package, comprising:
a substrate having an external upper surface, an external lower surface, and an opening extending therethrough from said external upper surface to said external lower surface;
a plurality of substrate pads attached to said upper surface of the substrate;
a semiconductor chip having an upper surface attached to said lower surface of the substrate, a plurality of banks each of which includes cells and a circuit for inputting/outputting data of the cells, a first group of bonding pads disposed on said upper surface of the semiconductor chip so as to be accessible via the opening in the substrate, a second group of bonding pads disposed on said upper surface of the semiconductor chip so as to be accessible via the opening in the substrate, and lines having a constant width connecting said second group of bonding pads to said banks so as to supply internal voltages to said banks via said second group of bonding pads;
an electrical connector electrically connecting at least one of said bonding pads of said first group to at least one of said plurality of substrate pads via said opening in the substrate;
a filling material filling the opening in the substrate to protect the bonding pads and the internal routing configuration; and
at least one auxiliary routing configuration disposed on a portion of the substrate, each said auxiliary routing configuration electrically connecting at least one of the bonding pads of said second group to at least one other of said bonding pads of said second group without being electrically conductively connected throughout the substrate to any of said plurality of substrate pads attached to said upper surface of the substrate.

5. The BGA package according to claim 4, wherein said electrical connector is a beam lead.

6. The BGA package according to claim 4, wherein said plurality of substrate pads comprise solder balls, and said electrical connector electrically connects a plurality of said bonding pads to a plurality of said solder balls via said opening in the substrate.

7. A ball grid array (BGA) package , comprising:
a substrate;
a plurality of substrate pads disposed on a surface of said substrate;
an auxiliary routing configuration extending along a surface of the substrate;
an electrical connector extending from at least one of said substrate pads;
a semiconductor chip attached to said substrate, said chip having a plurality of banks each of which includes cells and a circuit for inputting/outputting data of the cells, an external surface, a first group of bonding pads disposed on the external surface of said chip and at least one of which is connected to a respective on of said substrate pads by said electrical connector, a second group of bonding pads disposed on the external surface of said chip and connected to said external routing configuration, a respective internal voltage generator associated with each of said banks, and an internal routing configuration interconnecting the internal voltage generators and electrically connecting said group of bonding pads to said banks, and wherein the electrical resistance of said first routing configuration between the internal voltage generators and said bonding pads is greater than that of said auxiliary routing configuration.

8. The BGA package according to claim 7, wherein each of said internal voltage generators is a word line driving voltage (Vpp) generator.

9. The BGA package according to claim 7, wherein each of said internal voltage generators is a back bias voltage (Vbb) generator.

10. The BGA package according to claim 7, wherein each of said internal voltage generators is a bit line driving voltage (Vbl) generator.

11. The BGA package according to claim 7, wherein each of said internal voltage generators is an internal voltage converter (IVC).

* * * * *